(12) United States Patent
Cote et al.

(10) Patent No.: US 6,244,728 B1
(45) Date of Patent: Jun. 12, 2001

(54) LIGHT EMITTING DIODE ASSEMBLY FOR USE AS AN AIRCRAFT POSITION LIGHT

(75) Inventors: Richard A. Cote, Lake Forest Park; Mark S. Shander, Seattle; David F. King, Tukwila, all of WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/459,550

(22) Filed: Dec. 13, 1999

(51) Int. Cl.[7] .................. F21Y 101/02; F21W 101/06
(52) U.S. Cl. .................. 362/249; 362/80; 362/800
(58) Field of Search .................. 362/249, 80, 800, 362/555, 236, 61, 31; 340/945, 948, 953, 954, 958, 815.45, 815.47, 815.73; 345/39, 46, 82, 205, 206

(56) References Cited

U.S. PATENT DOCUMENTS

| | | |
|---|---|---|
| 4,298,869 | 11/1981 | Okuno . |
| 4,329,625 | 5/1982 | Nishizawa et al. . |
| 4,340,929 | 7/1982 | Konikoff et al. . |
| 4,628,419 | 12/1986 | Schmid . |
| 4,654,629 | 3/1987 | Bezos et al. . |
| 4,680,678 | 7/1987 | Iwaki . |
| 5,038,255 | 8/1991 | Nishihashi et al. . |
| 5,061,879 | 10/1991 | Munoz et al. . |
| 5,101,326 * | 3/1992 | Roney .................. 362/61 |
| 5,138,782 | 8/1992 | Mizobe . |
| 5,299,109 | 3/1994 | Grondal . |
| 5,388,035 | 2/1995 | Bodem, Jr. . |
| 5,442,258 | 8/1995 | Shibata . |
| 5,528,474 | 6/1996 | Roney et al. . |
| 5,567,036 * | 10/1996 | Theobald et al. .................. 362/80 |
| 5,632,551 * | 5/1997 | Roney et al. .................. 362/249 |
| 5,746,497 | 5/1998 | Machida . |
| 5,806,965 * | 9/1998 | Deese .................. 362/249 |
| 5,816,681 | 10/1998 | Tedesco . |
| 5,833,355 | 11/1998 | You et al. . |
| 5,890,794 | 4/1999 | Abtahi et al. . |

FOREIGN PATENT DOCUMENTS

| | | |
|---|---|---|
| 07201209 | 8/1995 | (JP) . |
| WO 9729320 | 8/1997 | (WO) . |

* cited by examiner

Primary Examiner—Laura K. Tso
Assistant Examiner—Bao Truong
(74) Attorney, Agent, or Firm—Alston & Bird LLP

(57) ABSTRACT

A light emitting diode (LED) assembly is provided for use as an airplane position light which meets Federal Aviation Regulation lighting requirements and lasts longer than conventional incandescent and halogen position lights, while being relatively lightweight, cheap, and requiring relatively little power for operation. The LED assembly includes a first plurality of circuit boards in electrical communication with a base circuit board, wherein each circuit board of the first plurality of circuit boards is parallel to every other one of the first plurality of circuit boards, but is disposed at an acute angle to the base circuit board. The LED assembly also includes a second plurality of circuit boards in electrical communication with the base circuit board, wherein each circuit board of the second plurality of circuit boards is disposed at a different angle to the base circuit board such that the second plurality of circuit boards form a fan-shaped structure. In addition, the LED assembly includes a plurality of light emitting diodes electrically mounted to said first plurality of circuit boards and to said second plurality of circuit boards. The circuit boards and LEDs may be identical to facilitate construction and maintenance of the aircraft position light, and to decrease the cost of manufacturing the aircraft position light. Furthermore, LEDs may be chosen to comply with Federal Aviation Regulations lighting color requirements, obviating the need for a position light cover.

20 Claims, 5 Drawing Sheets

| HORIZONTAL ANGLE (DEGREES) | FAR REQUIREMENT |
|---|---|
| 0-10 | 40 CANDELA |
| 10-20 | 30 CANDELA |
| 20-110 | 5 CANDELA |

| VERTICAL ANGLE (+/- DEGREES) | INTENSITY MULTIPLIER (MULTIPLY BY HORIZONTAL REQUIREMENT) |
|---|---|
| 0 | 1.0 |
| 0-5 | .90 TIMES INTENSITY |
| 5-10 | .80 TIMES INTENSITY |
| 10-15 | .70 TIMES INTENSITY |
| 15-20 | .50 TIMES INTENSITY |
| 20-30 | .30 TIMES INTENSITY |
| 30-40 | .10 TIMES INTENSITY |
| 40-90 | .05 TIMES INTENSITY |

LIGHT EMITTING DIODE ASSEMBLY FOR USE AS AN AIRCRAFT POSITION LIGHT

FIELD OF THE INVENTION

This invention relates generally to an aircraft position light, and more specifically, to an aircraft position light formed by a light emitting diode assembly.

BACKGROUND OF THE INVENTION

Federal Aviation Administration Regulations require an aircraft to include position (or navigation) lights which help identify the attitude and position of the aircraft to nearby airborne and land-based entities. More specifically, airplanes are required to have left and right position lights consisting of a red light and a green light spaced laterally as far apart as practical, and installed on the airplane such that, when the airplane is in normal flying position, the red light is on the left side of the airplane and the green light is on the right side of the airplane. Additionally, airplanes must have a rear position light which is a white light mounted as far aft as practical on the tail or on each wingtip of the airplane.

Most airplane manufacturers comply with these regulations by installing position lights on airplanes that are implemented through the use of incandescent light sources. Alternatively, some position lights operate through the use of halogen lamps, which can have a longer life expectancy than incandescent lamps. These two types of light sources are often utilized because they can achieve the light distribution and light intensity required by Federal Aviation Regulations, promulgated by the Federal Aviation Administration (FAA). The FAA requires position lights to be of a minimum intensity at a multitude of displacement angles in both horizontal and vertical planes, as defined by an airplane's orientation. Regulations also require that position lights may not exceed specific light intensity values in certain horizontal and vertical positions. That is, within a position light's intended field of coverage, the FAA establishes minimum intensities only, and outside the intended field of coverage, the FAA establishes maximum intensities. In this manner, an airplane's attitude and position can easily be determined from multiple viewing angles while at the same time insuring that the lights are not too intense beyond the position lights' field of coverage to confuse or overpower other pilots, aircraft lights, and ground-based entities.

In addition to horizontal and vertical light intensity requirements, Federal Aviation Regulations also require each position light to be of a specific color based upon International Commission on Illumination chromaticity coordinates. Federal Aviation Regulations use these chromaticity coordinates to define a particular range of chromaticities or colors suitable for position lights, defined as aviation red, aviation green, and aviation white. The left position light must be aviation red, the right position light must be aviation green, and the rear position light must be aviation white.

Because most position lights use white incandescent and halogen light sources, position light manufacturers often achieve these particular color requirements through the use of light covers. Light covers are typically made of colored glass, and are placed in front of the light source. However, the use of these covers in flight conditions and with incandescent or halogen light sources can result in undesired consequences. For example, the transmittance of red and green glass covers is only about 20 percent. This results in the use of a relatively high powered lamp to meet light intensity requirements. High powered incandescent and halogen light sources emit a large amount of heat, which can shatter light covers made of glass. Furthermore, light covers can change color and transmittance with temperature, so that light intensity and color may fluctuate outside of specified Federal Aviation Regulation requirements in response to temperature variations.

Because position lights must operate each time an aircraft is operating at night and because the lights can be difficult to access, especially on large commercial aircraft, it is advantageous for position lights to have long life and to perform reliably. Unfortunately, however, position lights which use conventional incandescent and halogen lamps can typically burn out after 1000 to 2000 hours of operation. This can occur at an inopportune time, such as in-flight or during a short layover on a runway. As a result, the lamps inside these position lights are frequently replaced while the airplane is on the tarmac. This frequent lamp replacement represents a high burden to airplane operators, maintenance crews, air traffic control, and any passenger or cargo on the airplane.

In addition to costs associated with aircraft delays and required maintenance, conventional light sources used in combination with colored filtered glass require a large power supply and can be very heavy, both of which are undesirable in airplane design. In this regard, incandescent and halogen position lights each require about 150–200 watts of power to produce intensity to meet FAA lighting requirements with suitable margin and redundancy. For example, 100–200 watt position lights are typically employed to provide twice the light intensity required under Federal Aviation Regulations. With multiple position lights on each airplane, this high power requirement contributes to a large power load, which is undesirable because of the limitations of the generators on an aircraft. Furthermore, the heavy weight of incandescent and halogen position lights and light covers make the lights difficult to install, and add to undesirable weight to the aircraft. Finally, (red and white) incandescent and halogen position lights emit light having a broad spectrum and relatively high amount of infrared energy, making the lights interfere with night vision imaging systems (NVIS), such as employed in military and night rescue applications.

Accordingly, there is a continuing need for a reliable position light which results in a longer life and requires less maintenance than conventional position lights, while achieving FAA light intensity and distribution requirements. Furthermore, it is desirable for such a light to have reduced power consumption and reduced manufacturing costs, to be lightweight, and to have a narrow spectral distribution and lower infrared energy than conventional position lights, thereby allowing for compatibility with night vision imaging systems.

SUMMARY OF THE INVENTION

The present invention utilizes an assembly of light emitting diodes (LEDs) to produce a position light which meets Federal Aviation Regulation lighting requirements while lasting longer than conventional incandescent and halogen position lights, and being relatively lighter, cheaper, and requiring less power than conventional position lights. Colored LEDs may be chosen to comply with Federal Aviation Regulations lighting color requirements, obviating the need for colored light covers. Furthermore, the narrow spectral distribution of LEDs results in the additional benefit that the position light of the present invention will interfere less with night vision imaging systems, as compared with conventional incandescent lamp based position lights.

According to one embodiment of the invention, a light emitting diode (LED) assembly for use as an aircraft position light includes a first plurality of circuit boards in electrical communication with a base circuit board. Each circuit board of the first plurality of circuit boards is parallel to every other circuit board of the first plurality of circuit boards. In addition, each of the first plurality of circuit boards is disposed at the same acute angle relative to the base circuit board. The LED assembly also includes a second plurality of circuit boards in electrical communication with the base circuit board.

Each circuit board of the second plurality of circuit boards is disposed at an angle to every other circuit board of the second plurality of circuit boards. As such, and wherein the second plurality of circuit boards form a fan-shaped structure. In addition, the LED assembly includes a plurality of light emitting diodes electrically mounted to said first plurality of circuit boards and to said second plurality of circuit boards.

Each circuit board of the first plurality of circuit boards and the second plurality of circuit boards in the LED assembly can be identical to every other circuit board of the first plurality of circuit boards and the second plurality of circuit boards, to facilitate manufacturing of the assembly, and to lower the costs associated with manufacture and maintenance. The plurality of LEDs can include rows of LEDs, where each row of LEDs is electrically mounted to a single circuit board of the first plurality of circuit boards and the second plurality of circuit boards. Each circuit board, in turn, can be electrically and mechanically connected to the base circuit board at a first edge thereof In this embodiment, the LEDs are, in turn, connected to the circuit board at a second edge, substantially opposite the first edge.

Furthermore, each circuit board of the first plurality of circuit boards and the second plurality of circuit boards can define an axis extending between the first and second edges of the circuit board that is disposed in a plane that is perpendicular to the base circuit board. In this embodiment, at least one LED of the plurality of LEDs can be connected to the circuit board so that the LED is aligned with the axis. Additionally, at least one LED may be located on the circuit board so that the LED is angled relative to the portions that cooperate to define an arched edge.

In one embodiment, the second edge of each circuit board can include multiple edges. LEDs can abut the multiple edge portions so that the LEDs are oriented in different directions. For example, a number of LEDs could abut a center edge portion so that the LEDs are parallel to vertical axis defined by the circuit board. In addition, LEDs can be mounted upon other edge portions that are angled relative to the center edge portion. For example, LEDs can be mounted at angles of ±12 and ±24° relative to the axis defined by the circuit board. Since the orientation of the LEDs is generally derived from the angle of the multiple edge portions with respect to the axis defined by the circuit board, the proper angular orientation of the LEDs may be ensured by placement of the LEDs directly adjacent the edge portions of the circuit board.

The manner in which the LEDs and circuit boards can be oriented on the base circuit board can be determined such that the position light meets and exceeds the lighting requirements of Federal Aviation Regulations. Using the known light distribution of a chosen LED, software operating on a computer may be utilized to determine the light intensity at all points in space of a position light according to the present invention. The software may do so by being programmed with conventional mathematical expressions which add known characteristics of light emission from multiple LEDs to produce a three dimensional plot of light intensity for a given assembly of LEDs. Therefore, through trial and error, the most effective embodiments of the present invention can be determined.

The LEDs can be chosen to meet the specific color requirements of Federal Aviation Regulations so that a colored light cover is not required to be placed in front of the position light. Furthermore, the LEDs chosen can have a narrow spectral distribution such that they interfere less with night vision imaging systems than conventional position lights.

According to another embodiment of the present invention, a light emitting diode (LED) assembly for use as an aircraft position light comprises a base circuit board and a plurality of light emitting diodes (LEDs) in electrical communication with the base circuit board. The LED assembly also includes a glass or optical plastic cover (lens) located adjacent the plurality of LEDs, where the optical cover includes a first optical section and a second optical section. The first optical section can include a first plurality of faces located on a side of the optical cover opposite the plurality of LEDs, wherein each face of the first plurality of faces is parallel to each other face of the first plurality of faces, and wherein each face of the first plurality of faces is positioned at the same acute angle relative to the base circuit board. The second optical section can include a second plurality of faces located on a side of the optical cover opposite the plurality of LEDs, wherein each face of the second plurality of faces is positioned at a different angle relative to the base circuit board than each other face of the second plurality of faces.

According to one aspect of the invention, each face of the first plurality of faces and each face of the second plurality of faces can correspond to a respective LED of the plurality of LEDs. Alternatively, each face of the first plurality of faces and each face of the second plurality of faces can correspond to at least one LED of the plurality of LEDs. Furthermore, like the first embodiment, each of the plurality of LEDs located within the position light assembly can be identical.

Other features and advantages of the present invention will become apparent to one skilled in the art upon examination of the following drawings and detailed description. It is intended that all such features and advantages be included herein within the scope of the present invention as defined by the appended claims.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A forward position light according to an aspect of the present invention will first be introduced, including an assembly of LEDs mounted in various directions, followed by a more detailed description of the individual components of the position light. Next, the use of various types of LEDs, including their orientation, effect on the orientation of components of the position light, and benefits, will be described. Finally, a software program will be described which allows a design engineer to tailor the forward position light to meet predetermined requirements.

Figure 1:
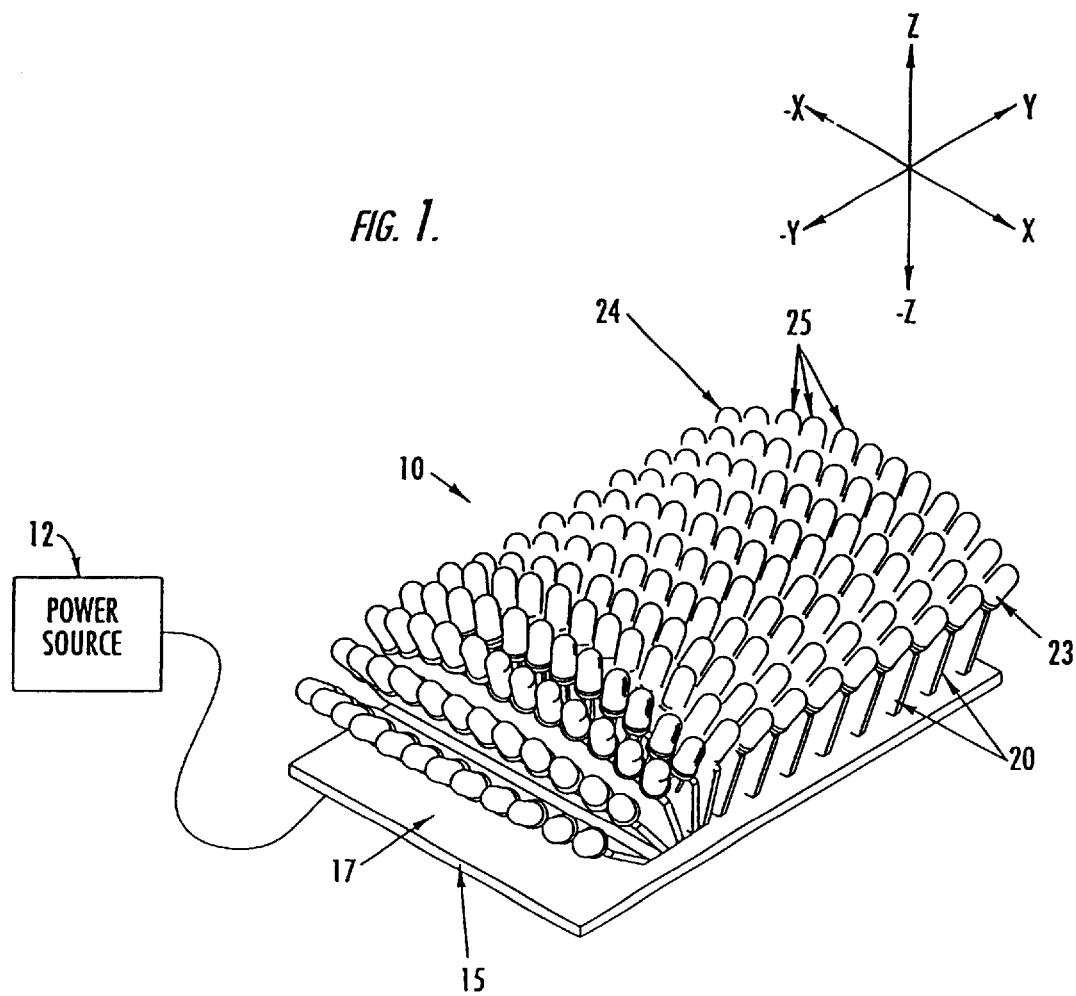
FIG. 1 shows a perspective view of a position light in accordance with an embodiment of the present invention.
Figure 5A:
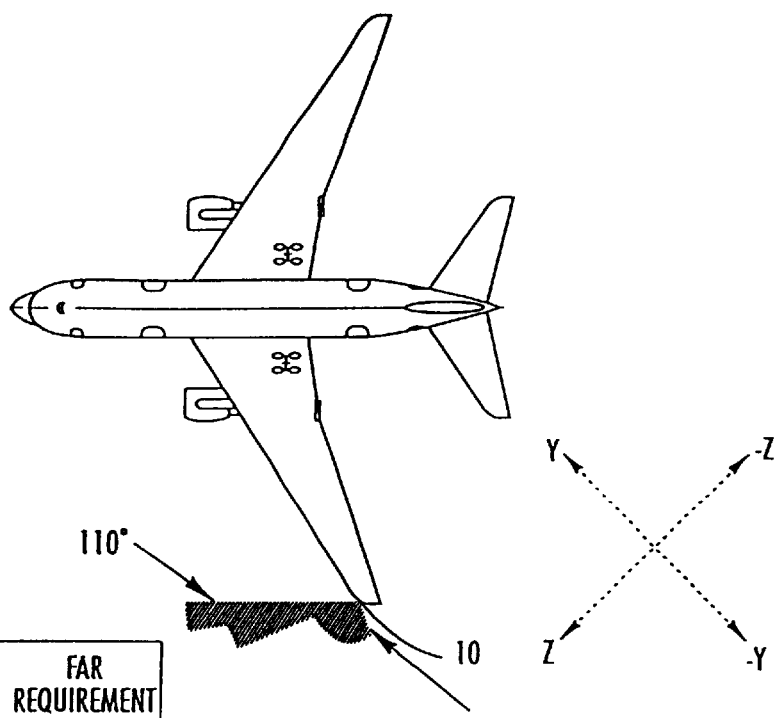
FIG. 5A shows the Federal Aviation Regulation forward position light intensity multiplier requirements for horizontal angles, and a graphical representation of the requirements with respect to a forward position light on the left wing of an airplane.

FIG. 1 shows a forward position light 10 in accordance with an embodiment of the present invention. The forward position light 10 includes a base circuit board 15 and a plurality of circuit boards that are electrically and mechanically connected to the base circuit board 15. The forward position light 10 also includes a plurality of light emitting diodes (LEDs) 25 electrically and mechanically mounted upon each circuit board 20. Additionally, the forward position light 10 includes a power source 12 in electrical communication with the base circuit board 15, which, in turn, provides power to the LEDs 25 which emit light in a multitude of directions relative to the base circuit board 15. The forward position light 10 can be mounted to an airplane by bolts, clamps, screws, adhesives, or by other suitable well known means. One location of a forward position light 10, on an airplane wing, is illustrated in FIG. 5A.

Figure 4:
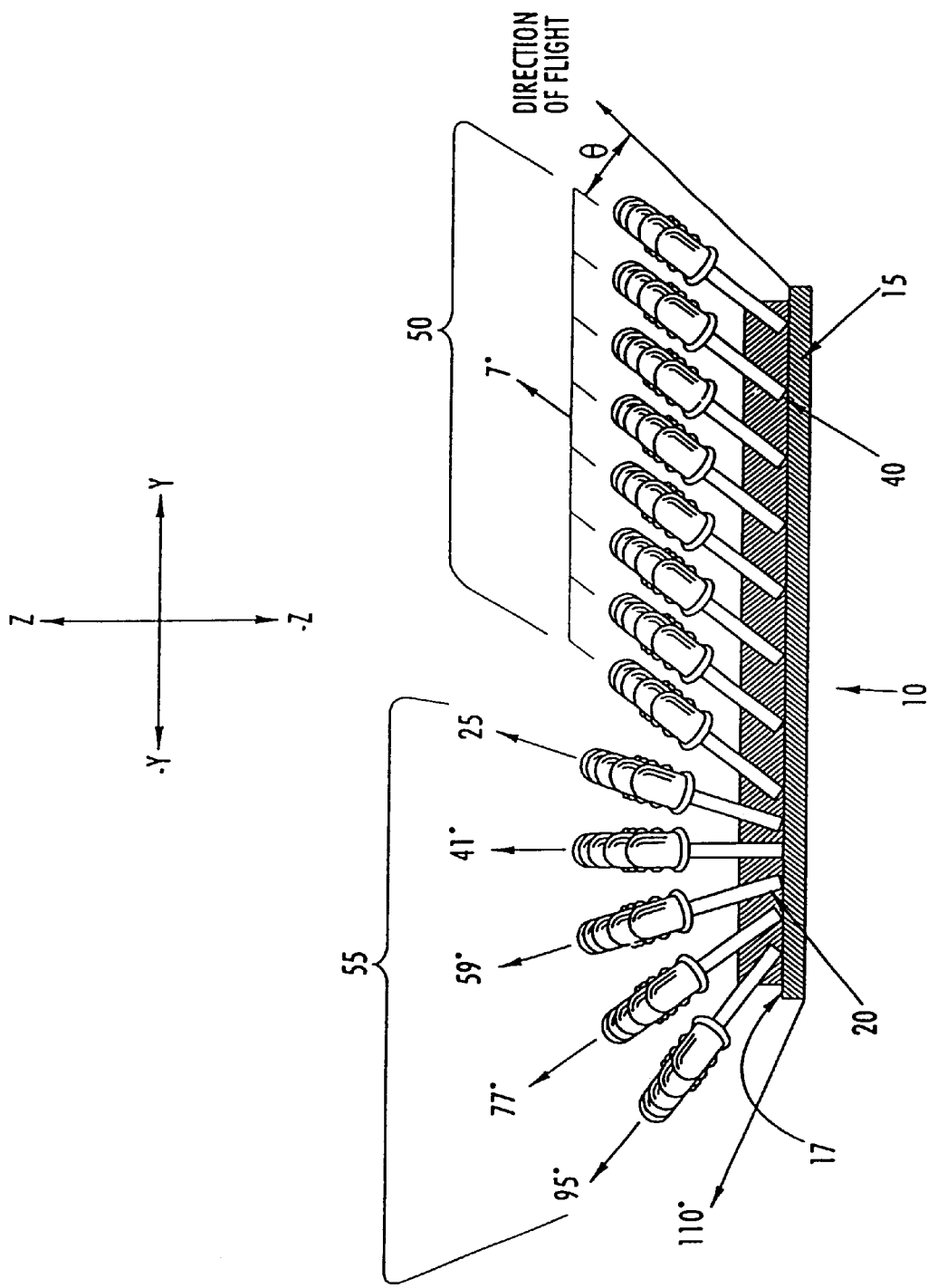
FIG. 4 shows a side view of the position light of FIG. 1 in accordance with an embodiment of the present invention.

Referring again to FIG. 1, the plurality of circuit boards can be connected to the base circuit board 15 at a variety of angles, so that at least one circuit board 20 is positioned at an acute angle relative to a surface 17 of the base circuit board 15. The plurality of circuit boards can be mounted directly to the base circuit board 15 using any suitable technique known to those of skill in the art. Alternatively, the plurality of circuit boards can be mounted to the base circuit board 15 using a mounting structure, as illustrated in FIG. 4. The purpose of angling or slanting at least one circuit board 20 and, more preferably, a plurality of circuit boards, with respect to the surface 17 is to achieve vertical (z-axis) light distribution in the directions of the y-axis and the −y-axis (i.e., about the ±x−axis in the z−axis direction), as shown in FIG. 1. Similarly, the plurality of LEDs 25 connected to each individual circuit board 20 may be oriented at different angles to achieve vertical (z-axis) dispersal of light in the x-axis and the −x-axis directions (i.e., about the ±y-axis in the z-axis direction). For example, the LEDs 25 can be mounted on a circuit board 20 in a fan-like manner so that at least one LED 23 points toward the x-axis, and at least one LED 24 points toward the −x-axis. Therefore, through the combined orientations of the circuit boards and LEDs 25 located on each board 20, the forward position light 10 can emit light in multiple directions in the 3-dimensional space defined by the x, y and z-axes. In the embodiment of FIG. 1, 156 LEDs are mounted on 13 circuit boards, so that the LEDs are at 30 different angular orientations, a configuration which will be described in more detail with reference to FIG. 4, below. However, the position light 10 can include different numbers of circuit boards and different numbers of LEDs, if so desired.

One advantage of the position light 10 according to the present invention is that minimum position light intensities can be achieved with a light requiring less power than conventional incandescent and halogen position lights. For example, the embodiment shown in FIG. 1, utilizing 156 conventional LEDs and 13 circuit boards, requires approximately 20 watts of power, as compared to conventional light sources requiring approximately 200 watts of power to meet FAA position light intensity requirements with suitable margin and redundancy. Such a decrease in power is favorable to aircraft design, where efficient power management is critical. Furthermore, unlike conventional position lights, the current through LEDs should be regulated via current regulating integrated circuit chips so that voltage variation will not affect the light intensity of the position light 10 or the current through the LEDs. This current regulation may be required because LEDs utilize semiconductors that have large fluctuations in current based upon small changes in voltage, which can have deleterious effects on LED semiconductor material. The position light 10, and its individual components, will be described in more detail with respect to FIGS. 2–5.

Figure 2:
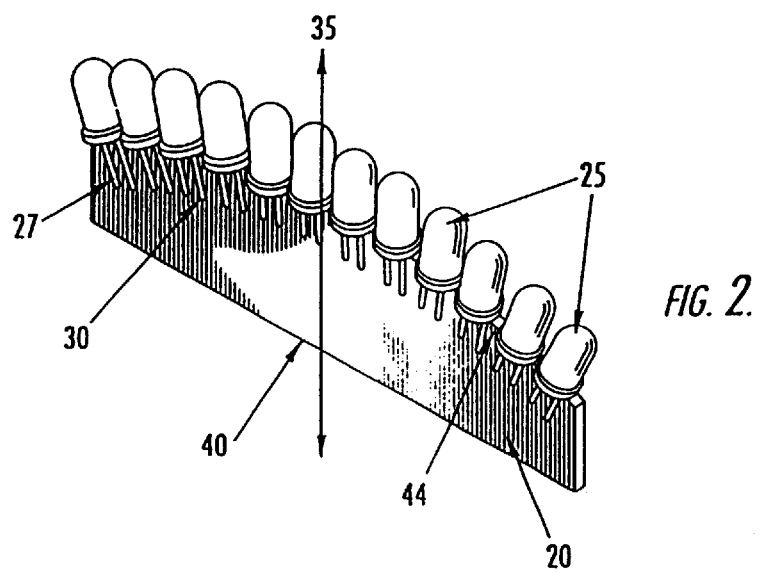
FIG. 2 shows a perspective view of a circuit board of the position light shown in FIG. 1 in accordance with an embodiment of the present invention.

FIG. 2 shows a perspective view of a circuit board 20 of the position light 10 shown in FIG. 1, in accordance with an embodiment of the present invention. According to one aspect of the invention each individual circuit board 20 of the position light 10 can be identical. Therefore, the circuit board 20 of FIG. 2 may be representative of any circuit board of the plurality of circuit boards included in the position light 10. However, it will be appreciated that each circuit board 20 can be unique in both shape and construction. Nonetheless, the use of identical circuit boards is preferred because identical circuit boards minimize the cost of manufacturing and maintaining the position light 10, and simplify its assembly and maintenance. Furthermore, the use of identical circuit boards can simplify the replacement of defective boards. The circuit board 20 can include a first edge 40 for electrical and mechanical connection with the base circuit board 15, and a second edge 44 substantially opposite the first edge 40. In addition, the circuit board can define an axis 35 that extends between the first and second edges 40, 44.

The axis 35 is disposed within a plane that is substantially perpendicular to the upper surface 17 of the base circuit board 15 once the circuit board is mounted thereon. A plurality of LEDs 25 are electrically and mechanically connected to the second edge 44 of the circuit board 20. In the embodiment of FIG. 2, the LEDs 25 are connected to the second edge 44 in a row formation.

The second edge 44 of the circuit board 20 typically includes a plurality of edge portions, as will be described in more detail with reference to FIG. 3A. In this embodiment, the LEDs 25 are preferably mounted along each of the edge portions. However, it will be appreciated by one of skill in the art that the LEDs 25 can also be mounted to the circuit board 20 in an alternative manner. For example, the LEDs 25 may be located on either one or both sides of the circuit boards proximate to the second edge 44. In any event, the LEDs 25 can emit light generally away from the surface 17 of the base circuit board 15. Because the second edge of the circuit board can be arched, as in the embodiment of FIG. 2, the LEDs 25 may emit light in a plurality of directions when mounted thereon. Additionally, because the LEDs 25 are mounted such that the LEDs 25 are oriented at different vertical displacements, side emissions off the LEDs 25 are not blocked by adjacent LEDs 25, which helps meet the vertical angle light intensity requirements, as discussed below.

The LEDs 25 are electrically connected 30 to the circuit board 20 by LED leads 27, which are illustrated with phantom lines. The LED leads 27 may be wire bonds or the like that provide jumper-type connection to the circuit board 20, or the LED leads 27 may be traces disposed on or within the circuit board 20. Alternatively, the circuit board 20 may include conductive terminals to which the LEDs 25 may be connected. As will be appreciated by those of skill in the art, the circuit board 20 can comprise a printed circuit board, a printed wiring board or any other board suitable to electrically and mechanically receive a plurality of LEDs 25, and be electrically and mechanically connected to base circuit board 15 such that the LEDs 25 may be powered by a power source 12 (see FIG. 1). In this regard, the base circuit board 15 and the plurality of circuit boards mounted thereupon typically include a network of electrical traces that effectively fan out the current provided by the power source 12 to the LEDs 25.

Figure 3A:
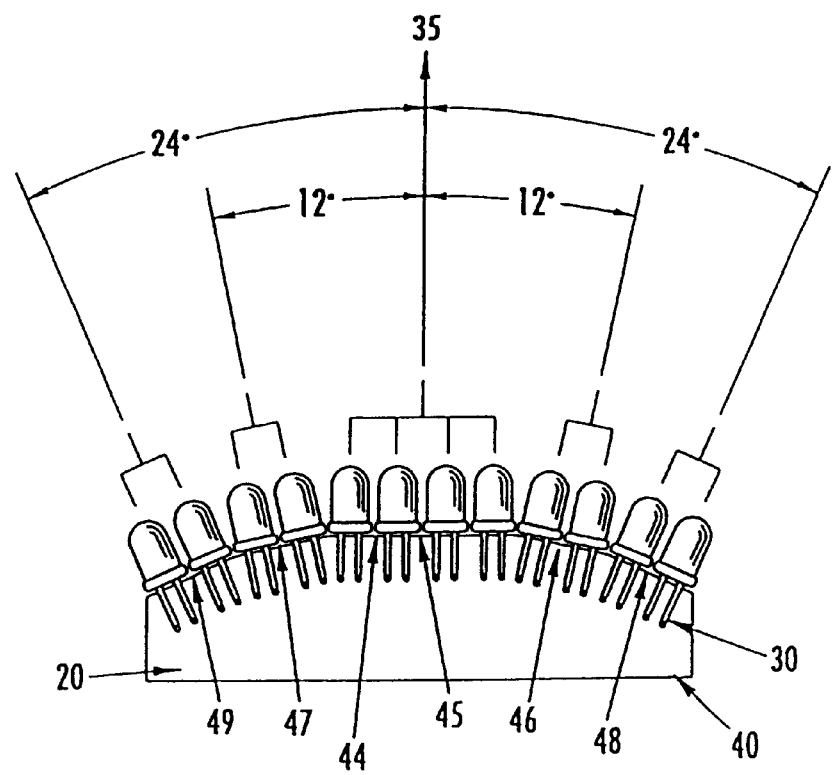
FIG. 3A shows a front view of the circuit board shown in FIG. 2 in accordance with an embodiment of the present invention.

FIG. 3A shows a front view of the circuit board 20 of FIG. 2, including the angular orientations of the LEDs 25 with respect to the axis 35 defined by the circuit board 20. The second edge 44 of the circuit board 20 can include multiple edge portions 45–49 that form an arched edge. In the embodiment shown in FIG. 3A, the LEDs 25 abut the multiple edge portions 45–49 so that the LEDs 25 are oriented in five (5) different directions. More specifically, four (4) LEDs 25 abut a center edge portion 45 of the second edge 44 so that the four LEDs are parallel to the axis 35; two (2) LEDs 25 abut a first middle edge portion 46 of the second edge 44 so that the two LEDs 25 are angled at 12° with respect to the axis 35; and two (2) LEDs 25 abut a first outer edge portion 48 of the second edge 44 so that the LEDs 25 are angled at 24° with respect to the axis 35. In similar fashion, two (2) LEDs 25 are mounted to a second middle edge portion 47 of the second edge 44, at −12° with respect to the axis 35, and two (2) LEDs 25 are mounted to second outer edge portion 49, at −24° with respect to the axis 35.

As can be appreciated by FIG. 3A, LEDs 25 oriented at specific angles (i.e., 0°, ±12°, or ±24°) from the axis 35 of the circuit board 20 derive their angular orientation from the angle of the multiple edge portions 45–49 with respect to the axis 35. In this embodiment, the middle edge portions 46, 47 are angled at ±12° degrees, respectively, and outer edges 48 and 49 are angled at ±24° degrees, respectively, to the center edge portion 45. Thus, specific angular orientations of the LEDs 25 may be achieved by placement of the LEDs 25 directly adjacent the multiple edge portions 45–49 at the second edge 44 of the circuit board 20. It will be appreciated that although one embodiment is shown, the LED assembly can have multiple configurations to produce multiple angular orientations of the LEDs 25. For example, the circuit board 20 may include more edge portions, such as a respective edge portion for each individual LED, or may comprise a smooth and continuous arched edge upon which the LEDs may be mounted. Moreover, the second edge 44 of the circuit board 20 may only include only a single, linear edge, and the angular orientations of the LEDs 25 may be created by the manner in which the LEDs 25 are mounted to the circuit board 20. For example, one or more LEDs 25 may be angled with respect to a linear edge by changing the length of an LED lead 27. Additionally, it should be appreciated by one of ordinary skill in the art that the number of LEDs 25 mounted on the circuit board 20 may vary according to the number of circuit boards included in the position light 10, as well as the types of LEDs 25 and the intensity of the LEDs 25, as will be discussed below.

Figure 3B:
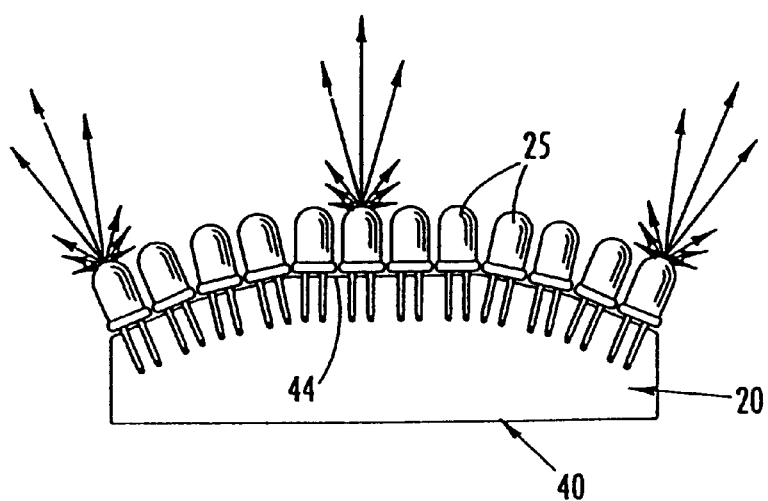
FIG. 3B shows a front view of the circuit board shown in FIG. 2, in accordance with an embodiment of the invention, including light distribution vectors.

FIG. 3B shows a front view of the circuit board shown in FIG. 2, in accordance with an embodiment of the invention, including light distribution vectors. Because the second edge of the circuit board can be arched, as discussed above, the LEDs 25 may emit light in a plurality of directions. The light distribution of three LEDs is illustrated in FIG. 3B with light distribution vectors. It will be appreciated that because the LEDs 25 are at different vertical displacements due to the arched second edge 44 of the circuit board 20, side emissions off the LEDs 25 are not blocked by adjacent LEDs 25, which helps the position light 10 meet Federal Aviation vertical angle light intensity requirements.

FIG. 4 shows a side view of the position light 10 of FIG. 1 in accordance with an embodiment of the present invention, including an mounting structure which mounts the plurality of circuit boards to the base circuit board 15. The mounting structure may be integral to the base circuit board, or may be separate from the base circuit board 15 and attached to the base circuit board 15 after each are independently constructed. The mounting structure can be constructed of any suitable material strong enough to hold the circuit boards in a steady position relative to the base circuit board 15, and which will not interfere with the operation of the position light. For example, the mounting structure may be formed of molded plastic. It should be appreciated that the mounting structure may facilitate the mounting of circuit boards at specific angles. It should also be appreciated that the mounting structure must allow the circuit boards to be electrically connected to the base circuit board 15.

FIG. 4 shows 13 circuit boards electrically and mechanically mounted to the base circuit board 15. As in FIGS. 1–3, the individual circuit boards 20 of the position light 10 are identical although mounted at different angles with respect to the surface 17 of the base circuit board 15. The specific orientations of each circuit board 20 and the respective LEDs 25 thereon were chosen in order to achieve and surpass the light intensity required by Federal Aviation Regulations when the position light 10 is fixed to an airplane wingtip.

In the embodiment of FIG. 4, the position light 10 includes a first plurality of circuit boards 50 and a second plurality of circuit boards 55, together comprising the plurality of circuit boards of the position light 10. Each circuit board 20 of the first plurality of circuit boards 50 is parallel to each other circuit board 20 of the first plurality of circuit boards 50. Additionally, each circuit board 20 of the first plurality of circuit boards 50 is positioned at an acute angle to the surface 17 of the base circuit board 15. On the contrary, each circuit board 20 of the second plurality of circuit boards 55 is angled relative to each other such that the second plurality of circuit boards 55 forms a fan-shaped structure.

The angular orientations of each circuit board 20 comprising the first plurality of circuit boards 50 and second plurality of circuit boards 55 is illustrated with respect to a Direction of Flight axis. The Direction of Flight (DOF) axis indicates the DOF of an airplane, and identifies the attitude of the position light 10 in relation to the DOF of an airplane when the light is mounted to an airplane wingtip. Also illustrated is an axis representing the 110° outboard angle, which is the maximum horizontal angle from the DOF axis requiring a minimum light intensity under Federal Aviation Regulations. This 110° angle can be more easily appreciated with reference to FIG. 5A, which shows a graphical representation of the 110° horizontal angle with respect to a position light 10.

In the embodiment of FIG. 4, each circuit board 20 of the first plurality of circuit boards 50 is mounted to the base circuit board 15 such that its axis 35 (shown in FIGS. 2 and 3) is at an angle θ of 7° from the DOF axis. In the illustrated embodiment, there are eight (8) circuit boards electrically and mechanically connected to the base circuit board 15 at this orientation. In the illustrated embodiment, there are also five (5) circuit boards comprising the second plurality of circuit boards 55. The vertical axis of the five individual circuit boards 20 are angled at 25°, 41°, 59°, 77° and 95° with respect to the DOF axis.

Figure 5B:
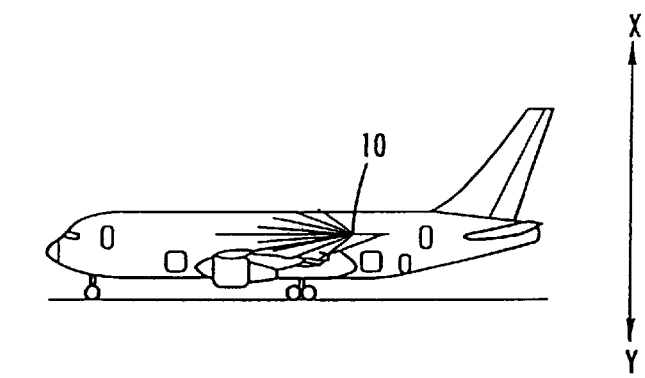
FIG. 5B shows the Federal Aviation Regulation forward position light intensity requirements for vertical angles, and a graphical representation of the requirements with respect to a forward position light on the left wing of an airplane.

The angles of displacement θ of each individual circuit board 20 with respect to the DOF is chosen based upon the light intensity requirements of Federal Aviation Regulations at various horizontal angles, as will be appreciated with reference to FIG. 5A. FIG. 5A shows a graphical representation of the horizontal requirements with respect to a forward position light on the left wing of an airplane and a table listing the light intensity requirements for all horizontal positions of such a light. For example, at a horizontal angle between 0–10°, Federal Aviation Requirements require a minimum light intensity of forty (40) candela. Thirty (30) candela of light intensity is required between 10–20° degrees, and five (5) candela is required at angles between 20–110° degrees from the DOF. The orientation of the forward light 10 on an airplane wing can be appreciated with reference to the Y-Z axis shown in FIG. 5A. Similarly, the placement of the LEDs 25 on each circuit board 20, as shown in FIG. 3, is based upon Federal Aviation Regulations requirements for light intensity in vertical displacements. FIG. 5B shows the Federal Aviation Regulation forward position light intensity requirements for vertical angles, and a graphical representation of the requirements with respect to a forward position light on the left wing of an airplane. The requirements for light intensity at vertical angles are symmetrical both above and below the position of the wing. Thus, referring to FIGS. 1 and 5B, light intensity requirements are equal for corresponding locations on the x-axis and −x-axis.

It will be appreciated by those of skill in the art that the particular angular orientation of each board 20 included in the first plurality of circuit boards 50 and the second plurality of circuit boards 55 may be varied. In one advantageous embodiment described above, however, and as will be explained further below, the preferred orientation of the circuit boards in FIG. 4, and the number of LEDs used, was selected to achieve twice the Federal Aviation Requirements for light intensity at any given vertical and horizontal displacement. However, as will be appreciated by one of ordinary skill in the art, additional angular displacements may be employed that still meet or achieve the minimum lighting requirements under Federal Aviation Regulations for position lights. For example, an alternative embodiment might include a plurality of circuit boards, where none of the circuit boards are parallel to each other. In an alternative embodiment, a larger number of circuit boards may be used, where the angular displacement of the circuit boards from the DOF may be different than those shown in FIG. 4. For example, circuit boards comprising the second plurality of circuit boards 55 in the embodiment of FIG. 4 may include any number of circuit boards that are oriented at angles of, for example, between 1° and 89°.

Preferred orientations of the individual LEDs 25 and circuit boards 20 can be determined by calculating LED positions using known performance characteristics of multiple LEDs placed in close proximity. First, it is known that when multiple LEDs are combined, their individual light patterns add together (i.e., superposition applies). Furthermore, if multiple LEDs with the same pattern of light are aimed in the same direction, the shape of the intensity or apotization pattern remains the same as that pattern emitted by an individual LED, but the magnitude of the light increases. Given these known phenomena, and Federal Aviation Regulation horizontal and vertical light intensity requirements, preferred orientations of the LEDs 25 and circuit boards 20 according to the present invention can be determined. First, however, the use of various types of LEDs, and the effects of their including their orientation, will be discussed.

As stated with respect to FIG. 3A, it will be appreciated that the types of LEDs 25 comprising the position light 10 may vary. In the embodiment of the invention illustrated in FIGS. 1–4, T 1-3/4 High Intensity 3020 LEDs (manufactured by Hewlett Packard Corporation, San Jose, Calif.) were utilized. The type of LEDs 25 may effect the number of LEDs and orientation and number of circuit boards 20 required to meet minimum light intensity requirements. For example, an LED used in the present invention can be a T 1-3/4 style LED, measuring 0.190 inches in diameter, which generally produces a narrow pattern of light; a HP Superflux (trademark of Hewlett Packard (BP) Corporation) LED, producing a broader light pattern; or a HP Barracuda LED, producing a batwing lighting pattern, which is most intense at specific angles off the LED's vertical axis. Furthermore, the exterior lens shape of the LED, the shape of the LED's internal reflector, the index of refraction of the encapsulating material surrounding the anode, cathode and die of the LED, and the location of the die relative to the lens and/or internal reflector dictate the intensity pattern of the LED device.

Because each circuit board shown in FIG. 2 is preferably exchangeable with any other circuit board in the position light, the LEDs 25 utilized throughout the position light 10 are preferably the same type, although this is not required. Additionally, each LED selected for an individual position light 10 should comply with Federal Aviation Regulation color requirements, so that need for a colored light cover is obviated. Red, green and white LEDs are commercially available from Hewlett Packard and other LED suppliers which meet the required chromaticity requirements. For example, an aviation green LED, made by Hewlett Packard (San Jose, Calif.), is constructed of InGaN (Indium gallum nitride), and an aviation red LED is constructed of AlInGaP (Aluminum Indium Gallium Phosphide). Through the use of these colored LEDs, the colored light cover can be eliminated, potentially resulting in less weight and cost, and overcoming difficulties resulting from the change of transmittance and light intensity which results when light covers are subjected to variations in temperatures, as in conventional position lights. It will be appreciated by those of skill in the art that a clear glass cover will still be required so that the LEDs will be protected and the wing will be aerodynamic.

An additional advantage of the use of LEDs in the present invention over incandescent and halogen position lights is the narrow spectrum of light generated by LEDs. LEDs are inherently more night vision imaging system compatible because they produce zero or very little radiance in the 450–930 nanometer range, compared with incandescent or filtered incandescent sources having much broader spectrums (incandescent sources produce energy up to and above 50,000 nm). Because night vision imaging systems (NVIS) have a spectral sensitivity range of 450 to 930 nanometers, LEDs do cause as much reduction in NVIS gain or interfere as much with their operation. NVIS can be utilized by military and night rescue operations, as well as many other applications.

The above-described embodiments of the present invention, including orientations of the LEDs 25 and circuit boards 20 illustrated in FIGS. 1–4, were determined using a software program operating on a computer. The software program, written specifically for this application using conventional computer software language (Mathcad 6.0, manufactured by Mathsoft) uses known mathematical expressions to allow a user to specify the intensity patterns and angular locations of hundreds of LEDs for the purpose of predicting the intensity pattern of a complete LED assembly. The software can compute the aggregate intensity pattern of the LED assembly and compare it at all angular locations with the Federal Aviation Regulation required intensity for a forward position light.

The software program allows a design engineer to specify the intensity pattern of any known LEDs being considered for a position light design. Based upon information provided from each LED manufacturer, the intensity of light emitted by each LED for any angular displacement can be entered. Next, a the design engineer can experiment with combinations of different LED types, with different intensities at various angular displacements, and can simulate the location of hundreds of LEDs at different horizontal and vertical angles. The software can add the light intensities of all the LEDs to produce a composite intensity pattern for the complete assembly of LEDs. In this manner, a complete analysis of a LED assembly can be made without building and testing prototypes.

The above-described embodiments of the position light 10, as shown and described with reference to FIGS. 1–4) were determined using the software program. However, it will be appreciated that a number of additional configurations may be determined. For example, a designer may construct a position light using any number of circuit boards oriented at various angles, and including any number of LEDs located thereon, to produce a position light sufficient to meet forward light intensity requirements of Federal Aviation Regulations. Based upon trial and error, any number of position lights can be tested for compliance with such regulations, including both forward (red and green) and aft (white) position lights. It will be appreciated that the software program is purely a time saving tool that approximates light intensity patterns based upon mathematical equations. Forward position lights according to the present invention can be constructed without the use of such a program. Additionally, because light intensities of a position light may vary from a mathematical approximation, the light intensities should be measured after construction of a position light to verify that the light meets federal aviation lighting requirements, as was accomplished in the embodiment shown in FIGS. 1–4.

The assembly of LEDs produces a position light which meets Federal Aviation Regulation lighting requirements while lasting longer than conventional incandescent and halogen position lights, and being relatively lighter, cheaper, and requiring less power conventional position lights. Furthermore, because colored LEDs may be chosen to comply with Federal Aviation Regulations lighting color requirements, colored light covers are not required. Moreover, the narrow spectral distribution of LEDs results in the additional benefit that the position light of the present invention does not interfere as nearly as much with the operation of night vision imaging systems, as compared with conventional position lights.

Figure 6A:
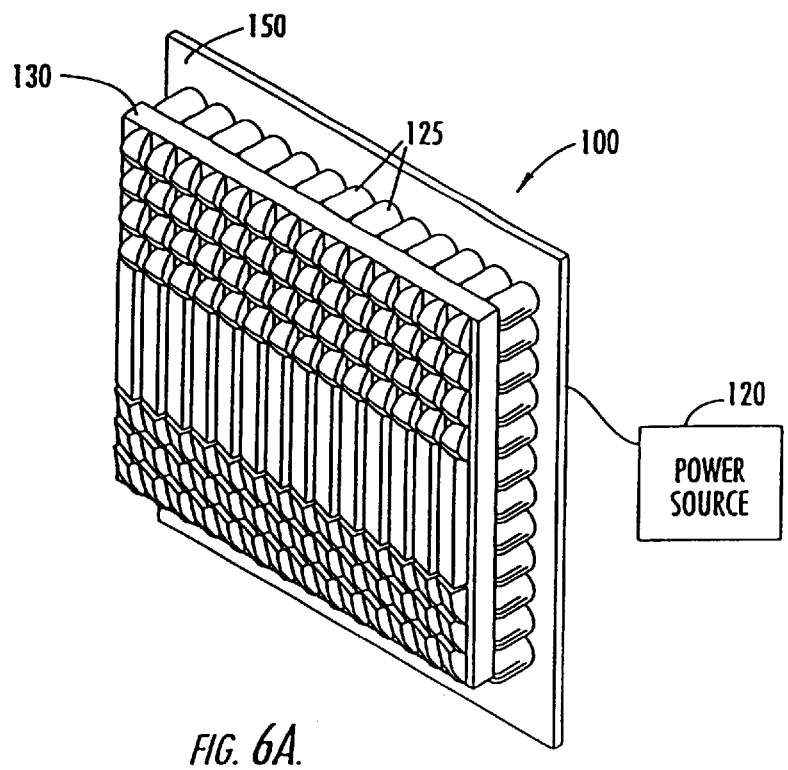
FIG. 6A shows a perspective view of a position light in accordance with another embodiment of the present invention
Figure 6B:
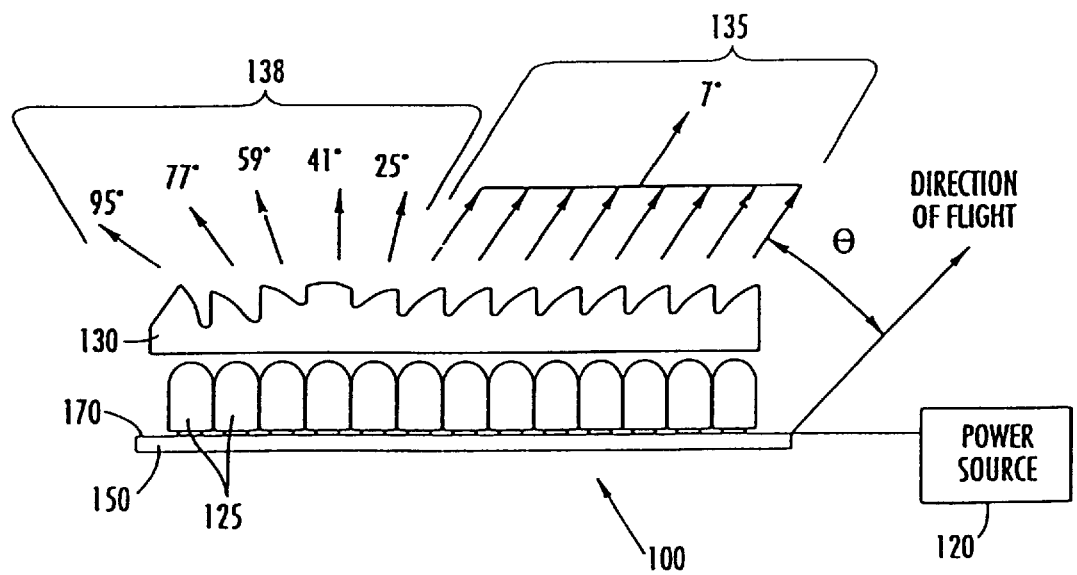
FIG. 6B shows a side view of the position light of FIG. 6A in accordance with an embodiment of the present invention.

FIG. 6A shows a perspective view of a position light 100 in accordance with another embodiment of the present invention, and FIG. 6B shows a side view of the position light 100. According to the embodiment shown in FIGS. 6A and 6B, a plurality LEDs 125 may be mounted directly to the base circuit board 150, in a manner well known in the art, and arranged in a grid or other formation, so that the LEDs 125 are oriented generally perpendicular to the base circuit board 150. To establish light intensity in a plurality of directions, a clear light cover or lens 130 may be placed over or located directly adjacent the LEDs 125, where the clear light cover 130 can contain one or more glass or optical plastic sections which enable the LEDs 125 to emit light in a multitude of directions. The clear optical light cover 130 directs light from the LEDs 125 in a multitude of directions and at the appropriate angles to achieve the required light distribution and intensity of required by Federal Aviation Regulations. It will be appreciated by those of skill in the art that the base circuit board is electrically connected to a power source, and that the LEDs 125 are in electrical communication with the base circuit board 150 so that the LEDs 125 can be powered. The clear optical light cover of this embodiment is made of optical plastic, but in an alternative embodiment the optical cover 130 could also be manufactured from glass or other suitable material. The transmission properties of the optical light cover 130 are specular (transparent) but in an alternative embodiment the optical light cover 130 could be specular or diffuse (translucent) or a combination of both in order to achieve the Federal Aviation Regulation requirements for light intensity of a position light. The clear optical light cover 130 is designed to use refraction in some regions and internal reflection in other regions to achieve the desired angular deflection of light originating from the LEDs 125. An alternative embodiment might include more than one circuit board 100 and optical light cover 130 aimed in the same direction or at different angles in relatively close proximity to one another or separated by some distance if necessary to facilitate a particular aircraft installation.

As shown in FIG. 6B, the clear optical light cover 130 can comprise a section 135 and a second section 138. The first section 135 can include a plurality of faces located on a side of the optical light cover 130 opposite the plurality of LEDs 125. Each of the plurality of faces in the first section 135 are parallel to each other, and are positioned at the same acute angle relative to the base circuit board 150. These faces are illustrated as angled to refract light at 720 horizontally with respect to the direction of flight (DOF) axis. The second section 138 can also include a plurality of faces located on a side of the optical light cover 130 opposite the plurality of LEDs 125. However, unlike those plurality of faces of the first section 135, each face of the second section 138 is positioned at a different (horizontal and vertical) angle relative to the base circuit board 150 than each other face of the second section 138. These faces are illustrated as angled to refract or internally reflect light horizontally at 25°, 41°, 59°, 77°, and 95° with respect to the DOF axis. The angles of these faces also cause the light to refract light in the vertical axis at −24°, −12°, 0°, 12° and 24°.

According to one aspect of the invention, each of the plurality of LEDs 125 located within the position light 100 can be identical. Furthermore, each face of the first plurality of faces and each face of the second plurality of faces can correspond to a respective LED of the plurality of LEDs 125. Alternatively, each face of the first plurality of faces and each face of the second plurality of faces can correspond to more than one LED of the plurality of LEDs 125.

The purpose of orienting the faces at the angles identified above is to permit the LEDs 125 to emit light in a multitude of directions to fulfill FAR light intensity requirements. However, as will be appreciated by those of skill in the art, like the embodiment shown in FIGS. 1–4, the embodiment of FIGS. 6A and 6B can be implemented using any number and type of LEDs, and can utilize a light cover having any number of sections oriented in a multitude of directions and angles. Moreover, like the first embodiment of the position light, the orientations of the sections, and the number of LED, as well as LED types, can be determined using a computer program, as described above. In addition, the optical transmittance properties of the light cover 130 can be specular (transparent), diffuse (translucent), or a combination of specular and diffuse. The light cover 130 can have regions which are specular for directing the light from an LED with minimal scattering, and other regions which are translucent for scattering the light from an individual LED or collection of LEDs. One which possesses skill in the art can appreciate how diffuse transmission could be used to distribute light in the extreme vertical angular locations where the FAA requires minimal intensity. There may also be areas on the light cover 130 which are opaque and transmit no light in a particular direction. Opaque areas on the light cover 130 could be used to limit light from exceeding the intensity in the angular region of an adjacent position light. One advantage of the position light illustrated in FIGS. 6A and 6B is that the position light 100 may cost less to manufacture and maintain than the position light 10 described with respect to FIGS. 1–4, because the LEDs 125 are mounted directly to the surface 170 of a base circuit board 150, and all at the same angle with respect to the base circuit board 150. It will be appreciated that an additional embodiment might be constructed where the angled faces are located on the side of the cover adjacent the LEDs 125.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A light emitting diode (LED) assembly for use as an aircraft position light, comprising:

a first plurality of circuit boards in electrical communication with a base circuit board, wherein each circuit board of the first plurality of circuit boards is parallel to each other circuit board of the first plurality of circuit boards, and wherein each circuit board is positioned at the same acute angle relative to the base circuit board;

a second plurality of circuit boards in electrical communication with the base circuit board, wherein each circuit board of the second plurality of circuit boards is positioned at a different angle relative to the base circuit board such that the second plurality of circuit boards form a fan-shaped structure; and a plurality of light emitting diodes (LEDs) electrically mounted to said first plurality of circuit boards and to said second plurality of circuit boards.

2. The LED assembly of claim 1, wherein each circuit board of the first plurality of circuit boards and the second plurality of circuit boards is identical to every other circuit board of the first plurality of circuit boards and the second plurality of circuit boards.

3. The LED assembly of claim 1, wherein the plurality of LEDs mounted to said first plurality of circuit boards and to said second plurality of circuit boards are identical.

4. The LED assembly of claim 1, wherein the plurality of LEDs mounted to a respective one of said first plurality of circuit boards and said second plurality of circuit boards form a fan-like pattern so that at least one LED of the plurality of LEDs is disposed at an angle relative to another LED of the plurality of LEDs.

5. The LED assembly of claim 1, wherein the plurality of LEDs comprise rows of LEDs, and wherein each row of LEDs is electrically mounted to a respective circuit board of the first plurality of circuit boards and the second plurality of circuit boards.

6. The LED assembly of claim 1, wherein each circuit board of the first plurality of circuit boards and the second plurality of circuit boards has opposed first and second edges, wherein each circuit board is mounted to the base circuit board at the first edge, and wherein the plurality of LEDs are mounted to said each circuit board at the second edge.

7. The LED assembly of claim 6, wherein each circuit board of the first plurality of circuit boards and the second plurality of circuit boards defines an axis that lies in a plane that is substantially perpendicular to the base circuit board and that extends from the first edge of said each circuit board to the opposed second edge, and wherein at least one LED of the plurality of LEDs mounted to said each circuit board is aligned with the axis.

8. The LED assembly of claim 6, wherein the second edge of each circuit board includes a plurality of edge portions that cooperate to define an arched edge.

9. The LED assembly of claim 8, wherein the plurality of LEDs are mounted to the first plurality of circuit boards and the second plurality of circuit boards such that the LEDs abut each of the plurality of edge portions.

10. A light emitting diode (LED) assembly for use as an aircraft position light, comprising:

a base circuit board;

a plurality of circuit boards mounted to the base circuit having opposed first and second edges, wherein each circuit board is in electrical and mechanical connection with the base circuit board along the first edge of the circuit board, and a plurality of light emitting diodes (LEDs) in electrical communication with each circuit board and abutting the second edge of the circuit board.

11. The LED assembly of claim 10, wherein at least one of the plurality of circuit boards is angled relative to another one of the plurality of circuit boards.

12. The LED assembly of claim 10, wherein at least one of the plurality of LEDs is angled with respect to another one of the plurality of LEDs.

13. The LED assembly of claim 10, wherein the second edge of each circuit board includes a plurality of edge portions that cooperate to define an arched edge.

14. The LED assembly of claim 10, wherein each circuit board of the plurality of circuit boards is identical.

15. The LED assembly of claim 10, wherein each LED of the plurality of LEDs is identical.

16. The LED assembly of claim 13, wherein the plurality of LEDs are mounted to each circuit board such that at least one LED abuts each of the plurality of edge portions.

17. A light emitting diode (LED) assembly for use as an aircraft position light, comprising:
- a base circuit board;
- a plurality of light emitting diodes (LEDs) in electrical communication with said base circuit board;
- an optical cover located adjacent said plurality of LEDs, wherein the optical cover comprises a first optical section and a second optical section, wherein:
    - said first optical section comprises a first plurality of faces located on a side of the optical cover opposite said plurality of LEDs, wherein each face of said first plurality of faces is parallel to each other face of said first plurality of faces, and wherein each face of said first plurality of faces is positioned at the same acute angle relative to the base circuit board;
    - said second optical section comprising a second plurality of faces located on a side of the optical cover opposite said plurality of LEDs, wherein each face of said second plurality of faces is positioned at a different angle relative to the base circuit board than each other face of said second plurality of faces.

18. The LED assembly of claim 17, wherein each of the plurality of LEDs are identical.

19. The LED assembly of claim 17, wherein each face of the first plurality of faces and each face of the second plurality of faces correspond to a respective LED of the plurality of LEDs.

20. The LED assembly of claim 17, wherein each face of the first plurality of faces and each face of the second plurality of faces correspond to at least one LED of the plurality of LEDs.

* * * * *